United States Patent
Duncan

[15] 3,707,677
[45] Dec. 26, 1972

[54] METHOD AND APPARATUS FOR MEASURING R. F. CURRENT GAIN OF A TRANSISTOR

[72] Inventor: David M. Duncan, San Francisco, Calif.

[73] Assignee: Communications Transistor Corporation, San Carlos, Calif.

[22] Filed: March 8, 1971

[21] Appl. No.: 121,909

[52] U.S. Cl. ..............................................324/158 T
[51] Int. Cl. ..............................................G01r 31/22
[58] Field of Search........................324/158 T, 158 R

[56] References Cited

OTHER PUBLICATIONS

Reich et al.; Junction Transistor...; Vol. 3; No. 4; April 1960; pp. 39,40,45,46.

*Primary Examiner*—Rudolph V. Rolinec
*Assistant Examiner*—Ernest F. Karisen
*Attorney*—Stanley Z. Cole

[57] ABSTRACT

The radio frequency current gain of a high frequency transistor is measured by sensing the radio frequency input and output of the transistor when a variable reactance in the output circuit is tuned to a setting that yields maximum output radio frequency current. The variable reactance in series with the output circuit essentially tunes out the stray capacitance and lead inductances within the transistor package such that the intrinsic current gain of the transistor is measured. The ratio of measured output r.f. current to the measured r.f. input current yields the intrinsic r.f. current gain of the transistor.

6 Claims, 2 Drawing Figures

PATENTED DEC 26 1972 3,707,677

INVENTOR.
DAVID M. DUNCAN
BY Stanley Z. Cole
ATTORNEY

METHOD AND APPARATUS FOR MEASURING R. F. CURRENT GAIN OF A TRANSISTOR

DESCRIPTION OF THE PRIOR ART

Heretofore, radio frequency current gain of a transistor has been measured by connecting the transistor into an input circuit and an output circuit. The input circuit presented a relatively high impedance, as of 50 ohms, to a radio frequency source to simulate an r.f. current generator, and the output circuit had a very low impedance, as of 1 ohm presented by a sampling resistor. The radio frequency voltage was measured across the sampling resistor to obtain a first voltage reading $V_t$. A shorting strap was connected between the input terminal and the output terminal of the transistor, thereby shorting same, and the r.f. voltage was again measured across the sampling resistor to obtain a shorted radio frequency voltage measurement $V_s$. The ratio of $V_t$ and $V_s$ gave a quantity heretofore considered determinative of the current gain of the transistor.

The problem with this prior art method of measuring the radio frequency current gain of a high frequency transistor is that it merely yields the current gain of the entire transistor package, such that the intrinsic current gain of the transistor die was not determinable from this measurement. Generally, in high frequency transistors, i.e. transistors operating above 25 MHz the r.f. current gain of the transistor package is limited by the lead inductance and stray capacitance of the transistor package and transistor electrodes rather than by the semiconductive parameters of the transistor die within the package. In the design of improved transistors it is desirable to obtain a measurement of the intrinsic r.f. current gain of the transistor, i.e., free of stray capacitance and lead inductance limitations of the transistor die and package in which the transistor die in to be mounted, such that effects of changes in the doping levels, diffusion depths, impurity concentration, can be determined.

SUMMARY OF THE PRESENT INVENTION

The principal object of the present invention is the provision of an improved method and apparatus for measuring the radio frequency current gain of a transistor.

In one feature of the present invention, the transistor is connected into a measuring circuit including an input circuit portion and an output circuit portion, such output circuit portion including a variable reactance, such variable reactance being tunable for cancelling out the reactance of elements within the transistor package, whereby measurements of the input and output r.f. current yield the intrinsic current gain of the transistor die, free of the reactive affects of the transistor die and leads within the transistor package.

In another feature of the present invention, the output circuit of the transistor measuring circuit includes a fixed inductance dimensioned to have a value of inductance to present a reactance substantially larger than the net reactance of the elements within the transistor package, and wherein the variable reactive impedance in the output circuit includes a variable capacitor connected in series with the fixed inductor.

In another feature of the present invention, input and output radio frequency current transformers are provided for sensing the input and output radio frequency current.

Other features and advantages of the present invention will become apparent upon a perusal of the following specification taken in connection with the accompanying drawings wherein:

DESCRIPTION OF THE PREFERRED EMBODIMENTS

Figure 1:
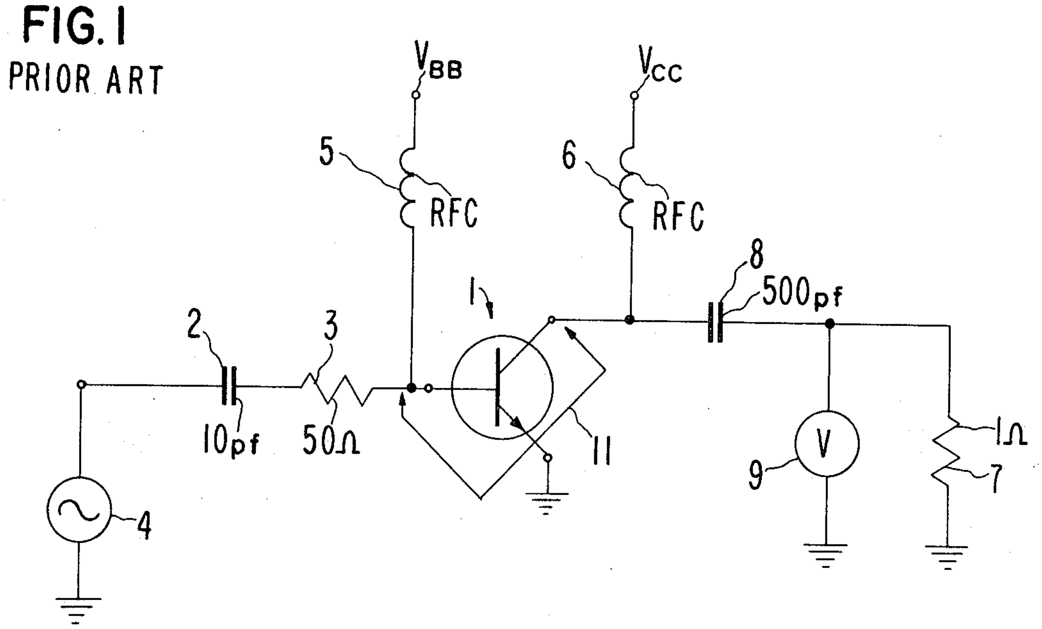
FIG. 1 PRIOR ART
FIG. 1 is a schematic circuit diagram of a prior art transistor measuring circuit for measuring R.F. current gain.

Referring now to FIG. 1, there is shown a prior art transistor measuring circuit for measuring radio frequency current gain of a transistor 1. More particularly, the circuit includes a high frequency transistor 1, such as A-C2512-CTC transistor, connected to an input circuit. The input circuit includes a series connection of a coupling capacitor 2, as of 10 pico-farads, and a resistor 3, as of 50 ohms, for providing a high impedance relative to the input impedance of the transistor 1 to simulate an r.f. current source.

In a common emitter configuration of the transistor 1, the base electrode of the transistor 1 is connected to the input circuit and the emitter is grounded. The base bias voltage $V_{BB}$ is connected to the base electrode of the transistor via the intermediary of a radio frequency choke 5. The collector voltage $V_{CC}$ is connected to the collector electrode of the transistor 1 via the intermediary of a second radio frequency choke 6.

The output circuit portion of the transistor 1 measuring circuit includes the series connection of a very low resistance sampling resistor 7, as of 1 ohm, and a relatively large capacitor 8, as of 500 pico-farads, connected in series across the transistor 1. A radio frequency voltmeter 9 is connected across the sampling resistor 7. A shorting strap 11 is provided for shorting the input and output terminals of the transistor 1.

The radio frequency current gain for the transistor 1 is measured by removing the short 11 and measuring the radio frequency voltage via voltmeter 9 to derive an output voltage $V_t$. The short 11 is then connected across the input and output terminals of the transistor 1 and the output voltage is read from voltmeter 9 to derive a shorted output voltage $V_s$. The high frequency current gain of the transistor $h_{fe}$ is determined from the ratio of $V_t$ over $V_s$.

The problem with the measurement of high frequency current gain utilizing the prior art circuit of FIG. 1 is that the circuit measures only the high frequency current gain of the transistor 1 including its package. In other words it measures only the high frequency current gain of the transistor 1 as modified by its package. Typically the r.f. current gain of the transistor, utilizing a state of the art transistor die, is limited by the stray capacitance and lead inductances of the package itself as opposed to the intrinsic current gain of the transistor die itself. Therefore, the measuring circuit of FIG. 1 is not particularly useful for measuring the intrinsic current gain of the transistor die. The intrinsic current gain of the transistor die is a useful parameter to be measured as an aid to designing improved transistor dies.

Figure 2:
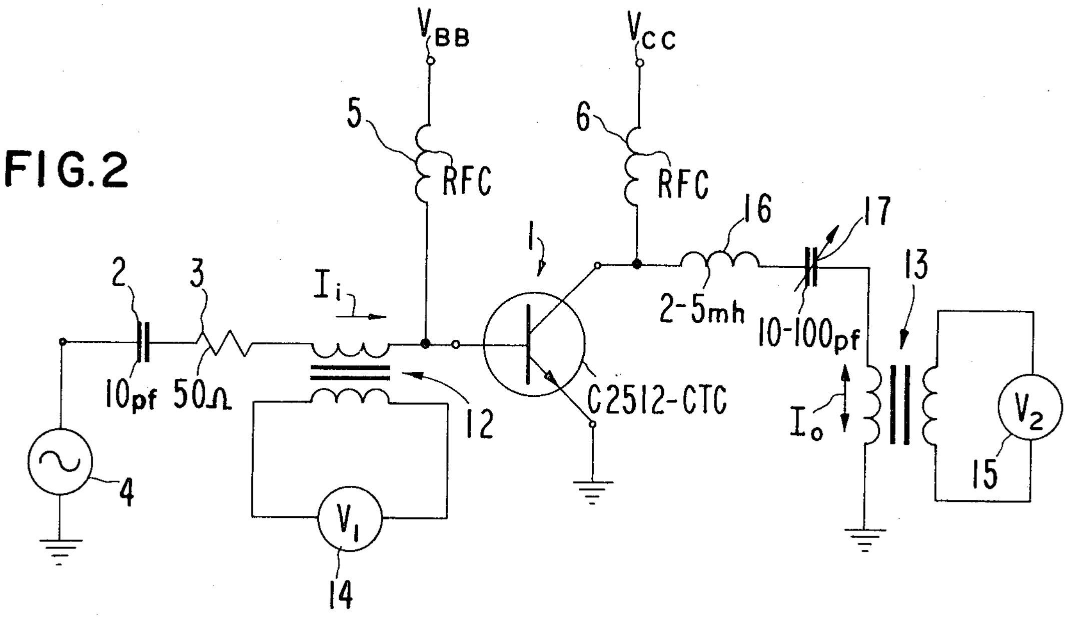
FIG. 2 is a schematic circuit diagram of a transistor measuring circuit for measuring intrinsic radio frequency current gain of a transistor die and employing features of the present invention.

Referring now to FIG. 2, there is shown a transistor measuring circuit of the present invention for measuring the intrinsic current gain of a transistor die. The measuring circuit of FIG. 2 is essentially the same as that of FIG. 1 with the exception that the voltmeter 9 and short 11 have been replaced by input and output radio frequency current transformers 12 and 13 connected in the input and output circuits, respectively, of the transistor 1. The current transformers 12 and 13 present substantially no impedance to the radio frequency current flowing in the circuit, but develop voltages $V_1$ and $V_2$ across the secondaries thereof which re proportional to the radio frequency current flowing in the respective primary circuits of the transformers 12 and 13. The output voltages of the transformers 12 and 13 are measured by radio frequency voltmeters 14 and 15, respectively, to derive measured voltages $V_1$ and $V_2$ proportional to the input and output radio frequency currents flowing in the input and output circuits of the transistor 1.

A fixed inductor 16 is connected in series in the output circuit of the transistor 1, such inductor 16 having an inductance, as of 2–5 nano-henries, this value of inductance being sufficient to provide an inductive reactance in series with the output circuit of the transistor 1 which is greater than the net reactive impedance of the stray capacitance and lead inductances of the transistor die and package 1. In this manner, the transistor package together with the fixed inductances 16 presents a net series inductive reactance in the output circuit. A variable capacitor 17, as of 10–100 picofarads, is connected in series with the output circuit. The capacitor 17 is variable over a range of capacitance to cancel out the series inductive reactance of the output circuit.

In operation, the intrinsic current gain of the transistor die within the transistor package 1 is measured by adjusting capacitor 17 for a maximum output r.f. current as indicated by a Maximum voltage $V_2$. The ratio of $V_2$ over $V_1$ yields the intrinsic r.f. current gain of the transistor die.

As an alternative to use of the series inductance 16 and the variable capacitance 17, a fixed capacitor and a variable inductor may be employed. Alternatively, if the leads and the transistor package present a net capacitive reactance to the output circuit, a variable inductor may be employed in the output circuit for making the above measurements. Also as another alternative, if the net reactance of the transistor die and package, as presented to the output circuit, is inductive merely a variable capacitance need be employed in the output circuit for tuning out the reactive effects of the leads and transistor die within the package 1.

What is claimed is:

1. In a radio frequency transistor measuring circuit for measuring radio frequency current gain $h_{fe}$, input circuit means for connecting a source of radio frequency current across the input terminals of the radio frequency transistor, output circuit means for connection across the output terminals of the radio frequency transistor, said input and output circuit means each including separate means for sensing the radio frequency current flowing in the respective circuits to produce an input radio frequency current signal and an output radio frequency current signal, said output r.f. current sensing means being connected in series with the main flow of output r.f. current of said transistor, said output circuit including a series connection of a variable reactive impedance means with said output r.f. current sensing means for tuning out the reactive effects of the leads and transistor die within the transistor package to obtain a measurement of the intrinsic radio frequency current gain of the transistor die free of the reactive effects of the transistor die and leads within the transistor package.

2. The apparatus of claim 1 wherein said output circuit means includes an inductor connected in series with the current sensing means and the main flow of output r.f. current of said transistor for presenting an inductance in series with the reactance of the elements within the transistor package, said inductive reactive means including a fixed portion being dimensioned to have a value of inductance such that when this inductance is considered with the reactive effects of the leads and elements within the transistor package the net effect of said fixed inductance and the reactive effects of the transistor package is to yield a net inductive reactance and wherein said variable reactive impedance means includes a variable capacitor means connected for presenting reactance in series with said inductor.

3. The apparatus of claim 2 wherein said current sensing means for sensing the input and output radio frequency currents include current transformer means.

4. In a method for measuring the intrinsic current gain of a transistor die as mounted in a transistor package having input and output terminals the steps of, connecting an input circuit across the input terminals of the transistor package for applying a DC potential across the input terminal of the transistor package and for applying radio frequency input current to the transistor, connecting an output circuit having a variable reactive impedance therein series connected with an r.f. current sensing means all being connected across the output terminals of the transistor package for applying a DC potential across the output terminals of the transistor package and for deriving a main flow of output radio frequency current from the transistor package through said variable reactance and said current sensing means in response to the flow of input radio frequency current, sensing the magnitude of the input and output radio frequency currents, varying the reactive impedance of the variable reactance in the output circuit while monitoring the output radio frequency current to obtain a setting of the variable reactance which yields maximum output radio frequency current, whereby the ratio of the input frequency current to the maximum output radio frequency current yields the intrinsic current gain of the transistor die at the frequency of the radio frequency current.

5. In the method of claim 4 wherein the step of connecting the output circuit across the output terminals of the transistor package includes the step of, connecting a fixed inductance into the output circuit to present such inductance in series with the reactance of the elements within the transistor package, and wherein said fixed inductive reactance of the output circuit exceeds the net reactance of the elements within the transistor package.

6. In the method of claim 5 wherein the variable reactance in the output circuit is a variable capacitive reactance.

* * * * *